US012389588B2

(12) United States Patent
Tang

(10) Patent No.: US 12,389,588 B2
(45) Date of Patent: Aug. 12, 2025

(54) MEMORY AND FORMING METHOD THEREOF

(71) Applicant: CHANGXIN MEMORY TECHNOLOGIES, INC., Hefei (CN)

(72) Inventor: Yi Tang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 515 days.

(21) Appl. No.: 17/815,954

(22) Filed: Jul. 29, 2022

(65) Prior Publication Data

US 2023/0413512 A1    Dec. 21, 2023

(30) Foreign Application Priority Data

Jun. 21, 2022  (CN) .......................... 202210703783.4

(51) Int. Cl.
  *H10B 12/00*    (2023.01)
(52) U.S. Cl.
  CPC .............. *H10B 12/30* (2023.02); *H10B 12/03* (2023.02); *H10B 12/05* (2023.02); *H10B 12/482* (2023.02)
(58) Field of Classification Search
  None
  See application file for complete search history.

(56) References Cited

U.S. PATENT DOCUMENTS 11,417,659 B2    8/2022  Son
2023/0422474 A1*  12/2023  Tang ...................... H10B 12/30

FOREIGN PATENT DOCUMENTS

CN           112635471 A      4/2021

* cited by examiner

*Primary Examiner* — Jack S Chen
(74) *Attorney, Agent, or Firm* — Syncoda LLC; Feng Ma

(57) ABSTRACT

The present disclosure relates to a memory and a forming method thereof. The method of forming a memory includes: forming a stacked layer on a surface of a substrate, the stacked layer including interlayer isolation layers arranged at intervals in a first direction and a sacrificial layer group located between adjacent two of the interlayer isolation layers, the sacrificial layer group including a first sacrificial layer, a second sacrificial layer, and a third sacrificial layer sequentially stacked in the first direction, and the stacked layer including a transistor region, where the first direction is a direction perpendicular to a top surface of the substrate; removing the first sacrificial layer in the transistor region to form a first gap; forming an active pillar in the first gap; removing the second sacrificial layer and the third sacrificial layer in the transistor region to form a second gap.

5 Claims, 12 Drawing Sheets a ⟷ a b ⟷ b

US 12,389,588 B2

MEMORY AND FORMING METHOD THEREOF

CROSS-REFERENCE TO RELATED APPLICATION

This application claims the priority of Chinese Patent Application No. 202210703783.4, submitted to the Chinese Intellectual Property Office on Jun. 21, 2022, the disclosure of which is incorporated herein in its entirety by reference.

TECHNICAL FIELD

The present disclosure relates to the technical field of semiconductor manufacturing, and in particular, to a memory and a forming method thereof.

BACKGROUND

As a semiconductor device commonly used in an electronic device such as a computer, a dynamic random access memory (DRAM) includes a plurality of memory cells, and each of the memory cells usually includes a transistor and a capacitor. The transistor has a gate being electrically connected to a word line, a source being electrically connected to a bit line, and a drain being electrically connected to the capacitor. A word line voltage on the word line can control on and off of the transistor, such that data information stored in the capacitor can be read through the bit line or data information can be written into the capacitor through the bit line.

Faster response speed, lower power consumption, and higher storage density are always required for a memory such as DRAM. As the size of a memory such as DRAM continues to shrink, the difficulty of a memory manufacturing process and the internal stress of the memory also continue to increase, thereby reducing the yield of the memory. Therefore, how to simplify the memory manufacturing process and improve the memory yield is a technical problem to be solved urgently at present.

SUMMARY

According to some embodiments, the present disclosure provides a method of forming a memory, including:

forming a stacked layer on a surface of a substrate, the stacked layer including interlayer isolation layers arranged at intervals in a first direction and a sacrificial layer group located between adjacent two of the interlayer isolation layers, the sacrificial layer group including a first sacrificial layer, a second sacrificial layer, and a third sacrificial layer sequentially stacked in the first direction, and the stacked layer including a transistor region, where the first direction is a direction perpendicular to a top surface of the substrate;

removing the first sacrificial layer in the transistor region, and forming a first gap;

forming an active pillar in the first gap;

removing the second sacrificial layer and the third sacrificial layer in the transistor region, and forming a second gap; and forming a word line covering a part of the active pillar in the second gap.

According to some other embodiments, the present disclosure further provides a memory, including:

a substrate; and a stacked structure located on a top surface of the substrate and including memory cells arranged at intervals in a first direction, where the first direction is a direction perpendicular to the top surface of the substrate;

each memory cell includes a transistor and a capacitor electrically connected to the transistor, the transistor includes an active pillar, the capacitor includes a bottom electrode layer, the bottom electrode layer includes a terminal portion and a body portion, and the terminal portion protrudes from the body portion in a second direction and is in contact and electric connection with the active pillar, where the second direction is a direction parallel to the top surface of the substrate.

DETAILED DESCRIPTION

Specific implementations of a memory and a forming method thereof provided in the present disclosure will be described below in detail with reference to the accompanying drawings.

Figure 1:
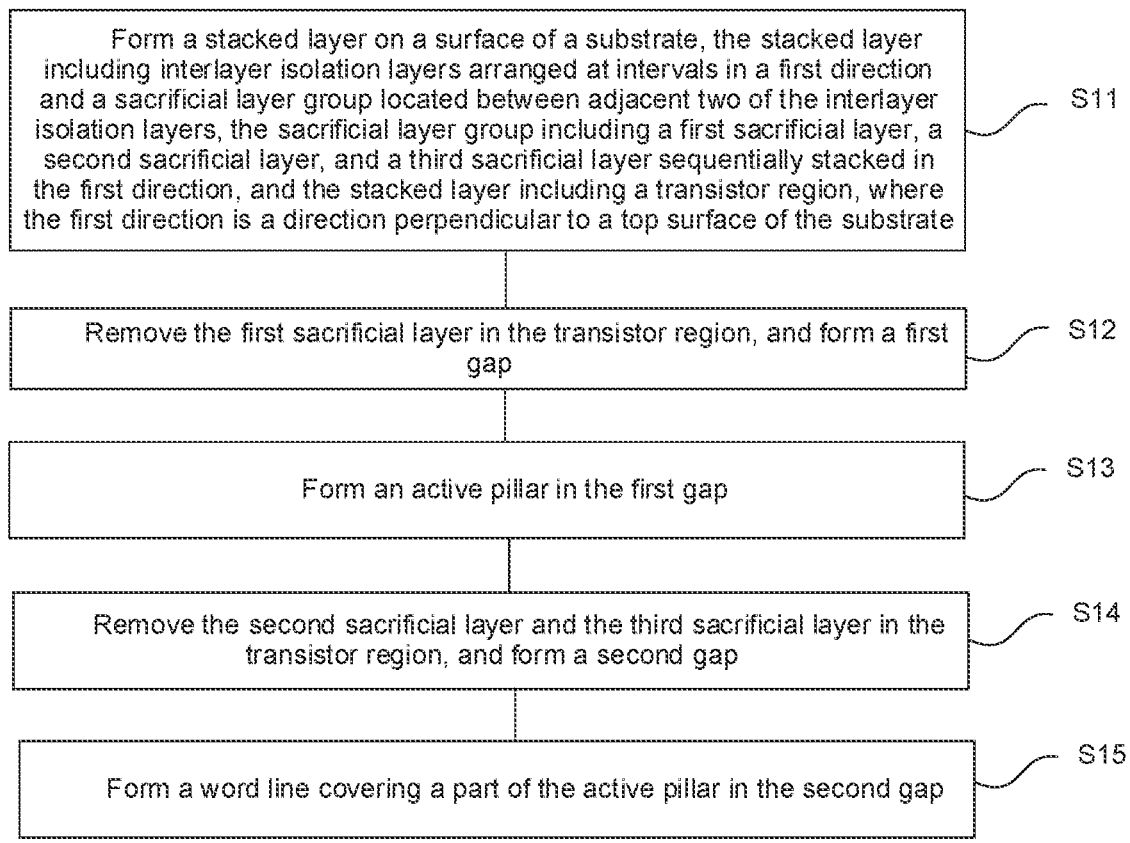
FIG. 1 is a flowchart of a method of forming a memory according to a specific implementation of the present disclosure.
Figure 2:
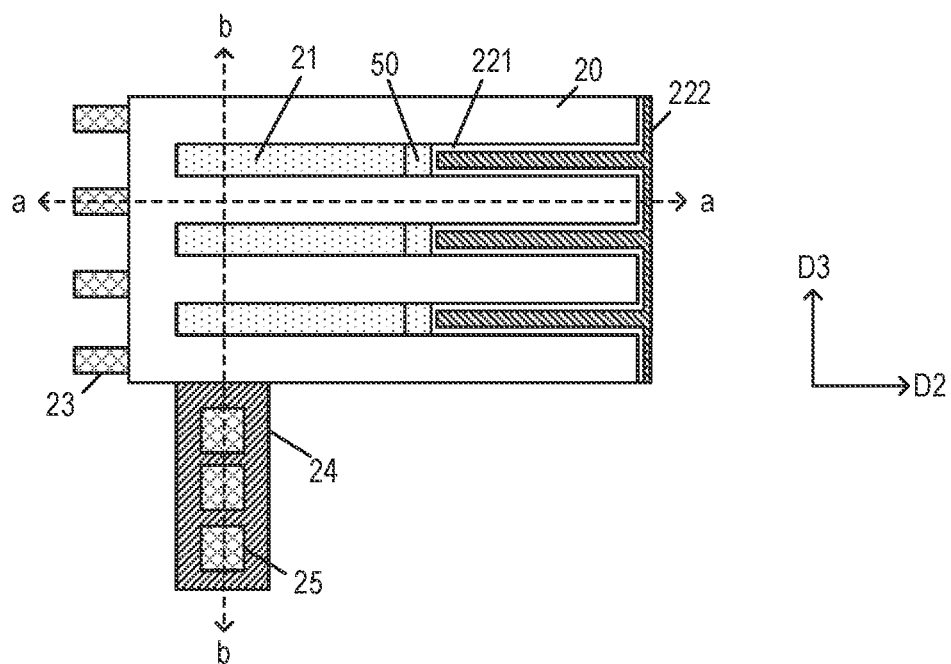
FIG. 2 to FIG. 20 are schematic structural diagrams of main processes for forming a memory according to a specific implementation of the present disclosure.
Figure 3:
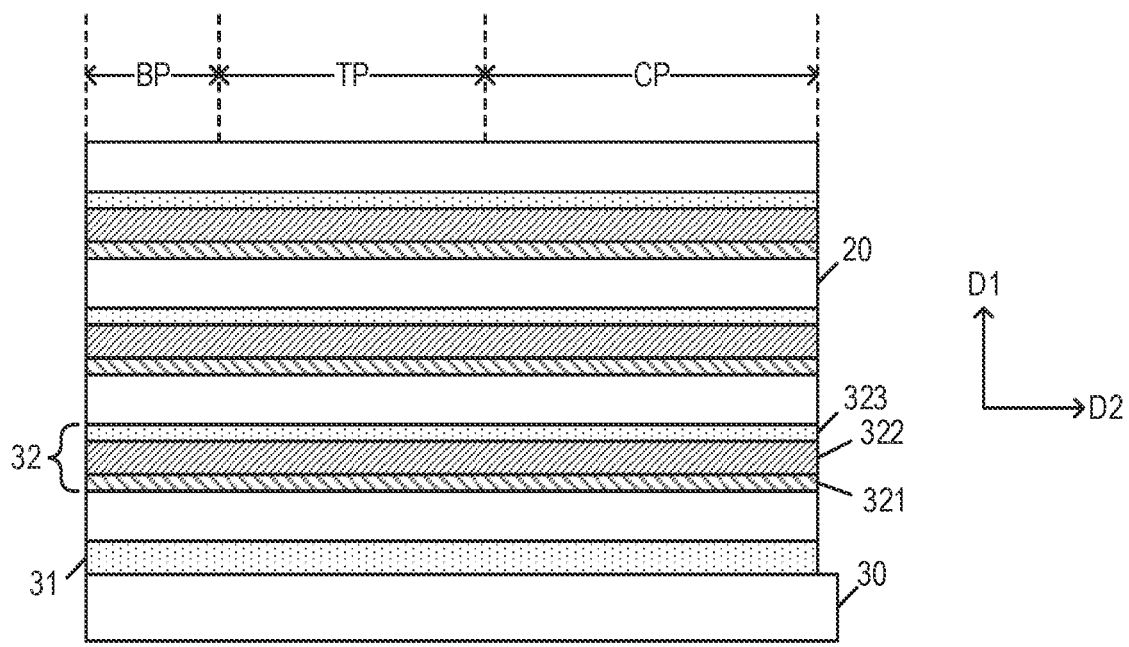

This specific implementation provides a method of forming a memory. FIG. 1 is a flowchart of a method of forming a memory according to a specific implementation of the present disclosure. FIG. 2 to FIG. 20 are schematic structural diagrams of main processes for forming a memory according to a specific implementation of the present disclosure, where FIG. 2 is a top schematic structural diagram of a memory formed in one embodiment of this implementation, and FIG. 3 to FIG. 20 are any one or two of a top schematic structural diagram of main processes for forming a memory, a schematic cross-sectional diagram of a a-a position in FIG. 2, and a schematic cross-sectional diagram of a b-b position in FIG. 2, to clearly indicate a forming process of the memory. As shown in FIG. 1 to FIG. 20, the method of forming a memory includes:

Step S11, form a stacked layer on a surface of a substrate 30, the stacked layer including interlayer isolation layers 20 arranged at intervals in a first direction D1 and a sacrificial layer group 32 located between adjacent two of the interlayer isolation layers the sacrificial layer group 32 including a first sacrificial layer 321, a second sacrificial layer 322, and a third sacrificial layer 323 sequentially stacked in the first direction D1, and the stacked layer including a transistor region TP, where the first direction D1 is a direction perpendicular to a top surface of the substrate 30, as shown in FIG. 3.

Specifically, the substrate 30 may be, but is not limited to, a silicon substrate. This specific implementation is described by using an example in which the substrate 30 is a silicon substrate. In other embodiments, the substrate 30 may alternatively be a semiconductor substrate such as a gallium nitride substrate, a gallium arsenide substrate, a gallium carbide substrate, a silicon carbide substrate or an SOI substrate. The substrate is configured to support a device structure thereon. The top surface of the substrate refers to a surface of the substrate 30 towards the stacked layer.

In one example, the interlayer isolation layers 20, the first sacrificial layer 321, the second sacrificial layer 322, and the third sacrificial layer 323 may be alternately stacked on the top surface of the substrate 30 by using a chemical vapor deposition process, a physical vapor deposition process, or an atomic layer deposition process to form the interlayer isolation layers 20 and the sacrificial layer group 32 alternately stacked in the first direction D1. The greater the number of the interlayer isolation layers 20 and the sacrificial layer group 32 that are alternately deposited, the greater the storage capacity of the formed memory. There should be a higher etching selection ratio between any two of the first sacrificial layer 321, the second sacrificial layer 322, the third sacrificial layer 323, and the interlayer isolation layers 20, to facilitate subsequent selective etching. In one example, the etching selection ratio between any two of the first sacrificial layer 321, the second sacrificial layer 322, the third sacrificial layer 323, and the interlayer isolation layers 20 should be greater than 3. In one example, the sacrificial layer group 32 may have a thickness of 30-60 nm in the first direction D1, to reserve an enough space for formation of the transistor and the capacitor, and be helpful to control the overall size of the memory finally formed.

To simplify the forming process of the sacrificial layer group 32 and reduce the cost of the sacrificial layer group 32, in some embodiments, the first sacrificial layer is made of a low-dielectric-constant material, the second sacrificial layer is made of undoped polycrystalline silicon, and the third sacrificial layer is made of silicon dioxide. The low-dielectric-constant material refers to a material with a dielectric constant less than 3. For example, the low-dielectric-constant material may be, but not limited to, one or a combination of two or more of SiOH, SiOCH, FSG (fluorosilicate glass), BSG (borosilicate glass), PSG (phosphosilicate glass), and BPSG (borophosphosilicate glass).

In one embodiment, a substrate isolation layer 31 may also be provided between the substrate 30 and the stacked layer, to isolate the substrate 30 and the stacked layer, and further reduce the stress between the substrate 30 and the stacked layer. The substrate isolation layer 31 may be made of an insulating dielectric material such as oxide (such as silicon dioxide).

Step S12, remove the first sacrificial layer 321 in the transistor region TP, and form a first gap.

Figure 12:
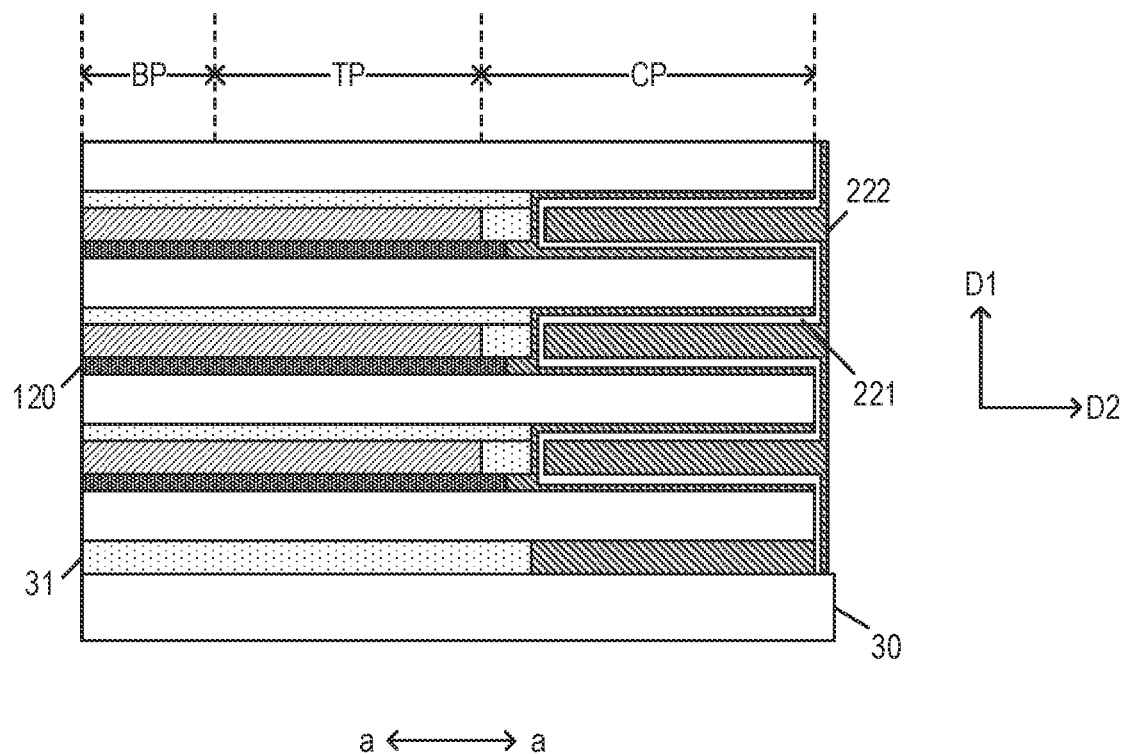

Step S13, form an active pillar 120 in the first gap, as shown in FIG. 12.

In some embodiments, the stacked layer further includes a capacitor region CP located on a side of the transistor region TP. Before the first gap is formed, the method of forming a memory further includes:
  remove the sacrificial layer group 32 in the capacitor region CP, and form a third gap 41, as shown in FIG. 4; and
  form a capacitor in the third gap 41.

Figure 4:
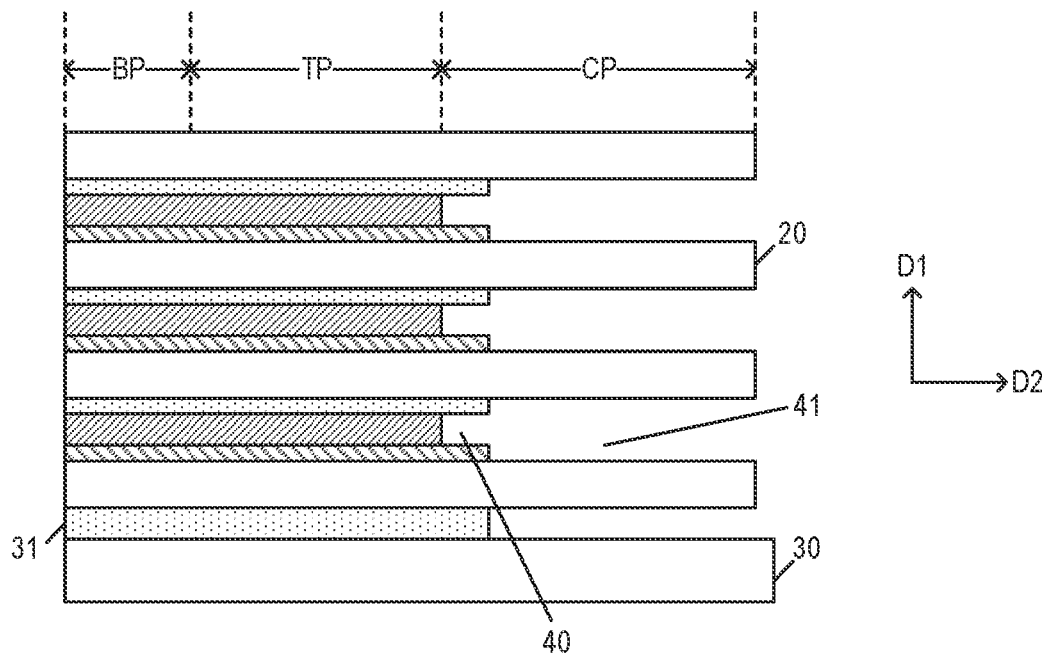
Figure 5:
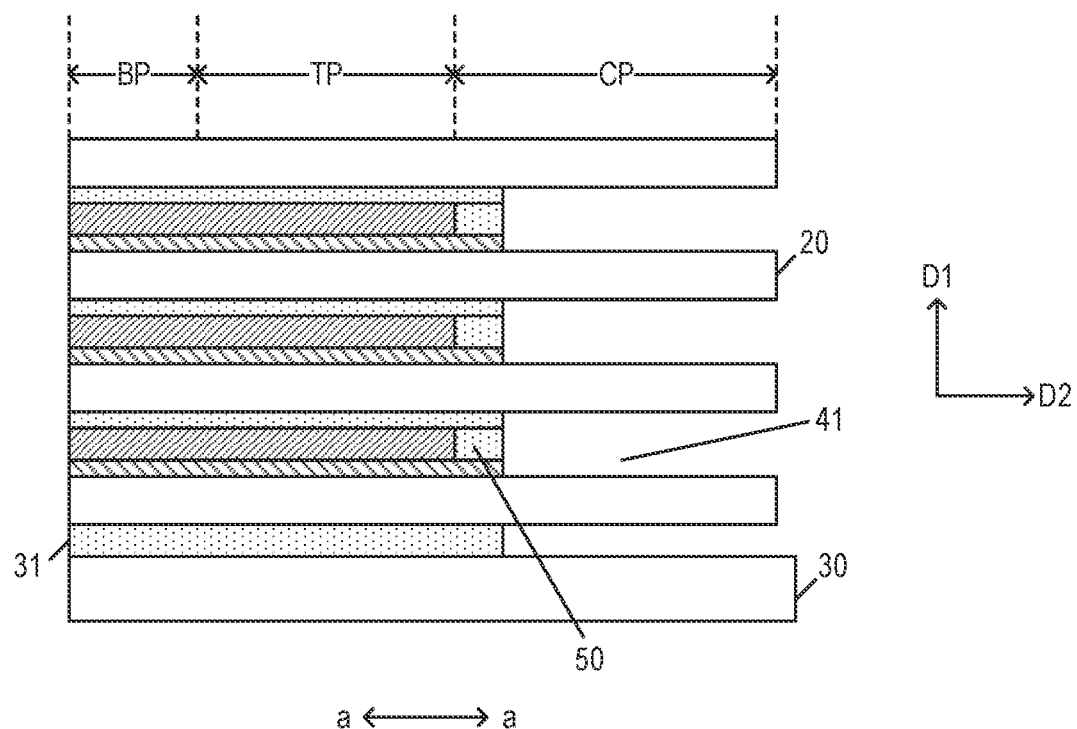

In some embodiments, the forming a third gap 41 includes:
  remove the second sacrificial layer 322 entirely in the capacitor region CP, and a part of the first sacrificial layer 321 and a part of the third sacrificial layer 323, and form a first trench 40 located between a remaining part of the first sacrificial layer 321 and a remaining part of the third sacrificial layer 323, and the third gap 41 located between adjacent two of the interlayer isolation layers 20 and communicated with the first trench as shown in FIG. 4; and form a first isolation layer 50 filling up the first trench 40, as shown in FIG. 5.

Specifically, after the stacked layer is formed on the top surface of the substrate 30, the transistor region TP, and the capacitor region CP located on the outer side of the transistor region TP in the second direction D2 are defined in the stacked layer. The second direction D2 is a direction parallel to the top surface of the substrate 30. Next, the first sacrificial layer 321, the second sacrificial layer 322, and the third sacrificial layer 323 in the capacitor region CP may be etched by using a lateral etching process, and an etching amount of the second sacrificial layer 322 is greater than that of the first sacrificial layer 321 and that of the third sacrificial layer 323, thereby forming the first trench 40 located between a remaining part of the first sacrificial layer 321 and a remaining part of the third sacrificial layer 323, and the third gap 41 located between adjacent two of the interlayer isolation layers 20 and communicated with the first trench 40, as shown in FIG. 4. Thereafter, the insulating dielectric material such as an oxide (such as silicon dioxide) may be deposited in the first trench 40, to form the first isolation layer 50 filling up the first trench 40. In one example, the first isolation layer 50 has a width of 30-60 nm in the second direction D2, thereby reducing a parasitic capacitance between the capacitor (especially a bottom electrode layer in the capacitor) and a gate electrode of the transistor while improving the insulating performance of the first isolation layer 50.

The etching amount of the second sacrificial layer 322 is greater than that of the first sacrificial layer 321 and that of the third sacrificial layer 323 in the etching process. On the one hand, subsequent formation of the first isolation layer 50 for isolating the word line and the capacitor in the first trench 40 is facilitated; and on the other hand, the reduction of electric leakage between the word line and the capacitor is also facilitated.

Figure 6:
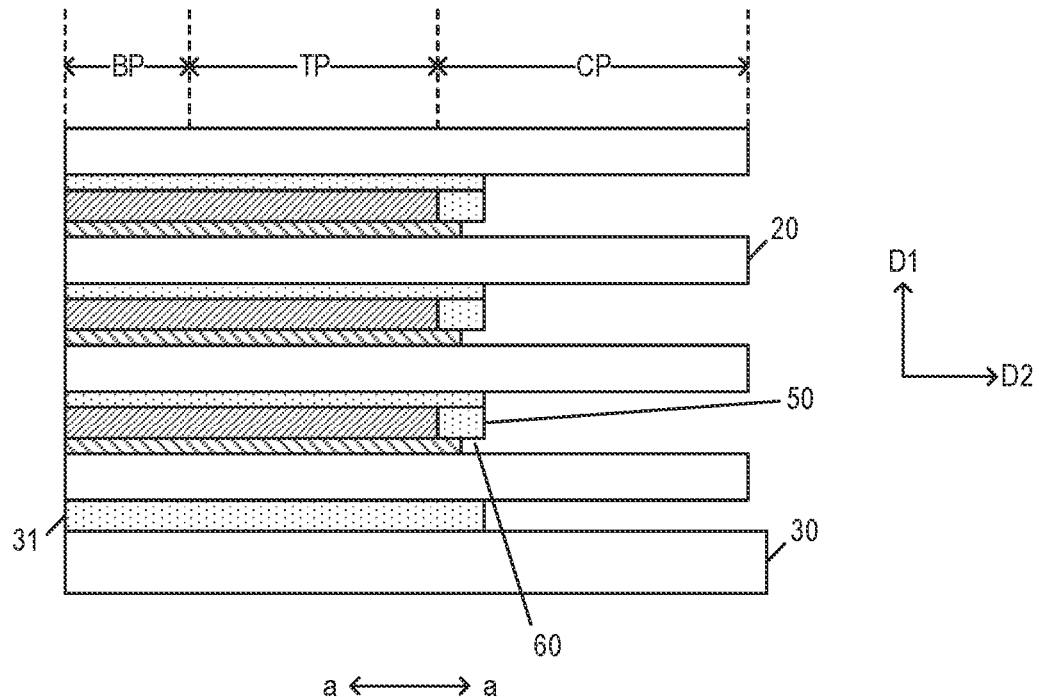
Figure 11:
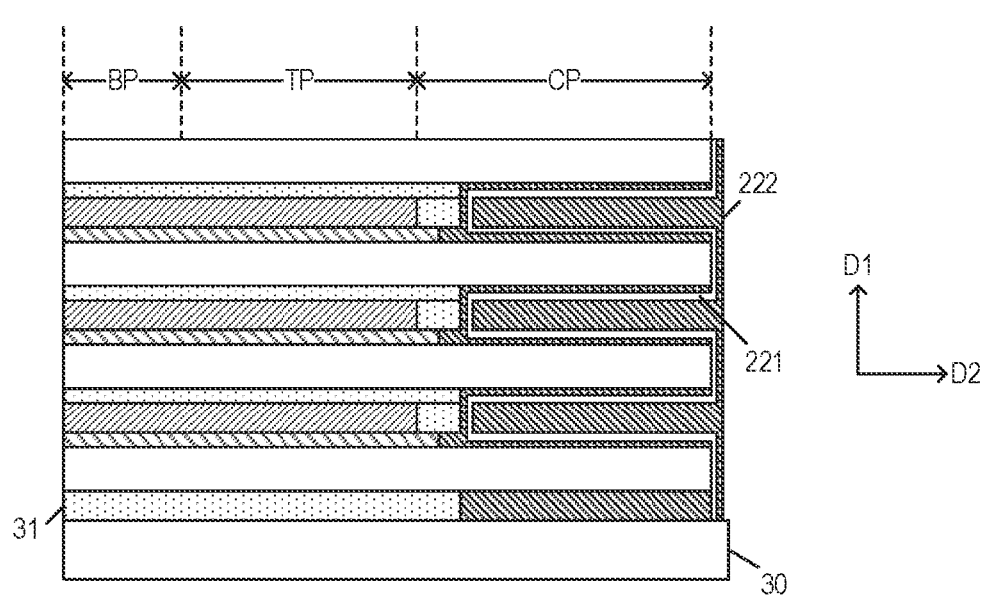

In some embodiments, the forming a capacitor in the third gap 41 includes:
  remove a part of the first sacrificial layer 321 below the first isolation layer 50, and form a second trench 60 communicated with the third gap 41, as shown in FIG. 6;
  form a bottom electrode layer filling up the second trench 60 and covering an inner wall of the third gap 41;
  form a dielectric layer 221 covering a surface of the bottom electrode layer; and
  form a top electrode layer 222 covering a surface of the dielectric layer 221, as shown in FIG. 11.

Figure 7:
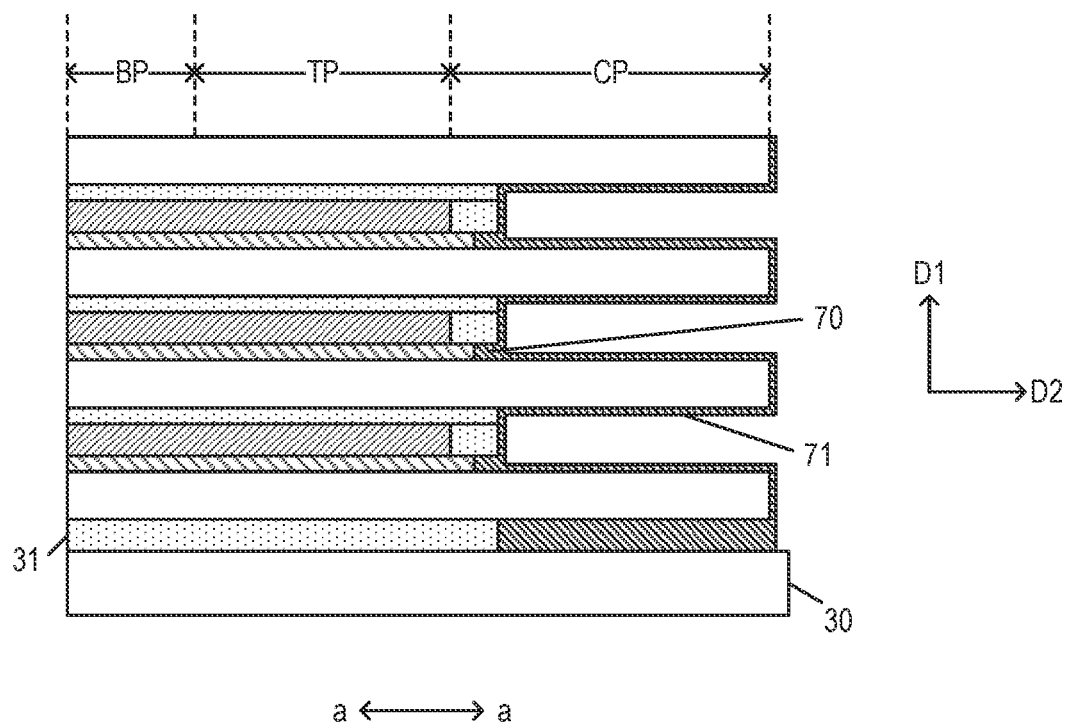

Specifically, a part of the first sacrificial layer 321 in the capacitor region CP is etched again to form the second trench 60 located between the first isolation layer 50 and the interlayer isolation layer 20, as shown in FIG. 6. Next, a bottom electrode material (such as tungsten, TiN, or other conductive materials) is deposited in the second trench 60 and on the inner wall of the third gap 41, to form a terminal portion 70 filling up the second trench 60, and synchronously form a body portion 71 covering the inner wall of the third gap 41; and the terminal portion 70 and the body portion 71 jointly constitute the bottom electrode layer of the capacitor, as shown in FIG. 7. The terminal portion 70 and the body portion 71 are in direct contact and electric connection, and the terminal portion 70 protrudes from the body portion 71 in the second direction D2. The terminal portion 70 is lower than the body portion 71 in the first direction D1. The terminal portion 70 is formed and electrically connected to the transistor, which not only contributes to reducing the contact resistance between the capacitor and the transistor, but also ensures the stability of connection between the transistor and the capacitor, thereby further improving the electric performance of the memory.

Figure 8:
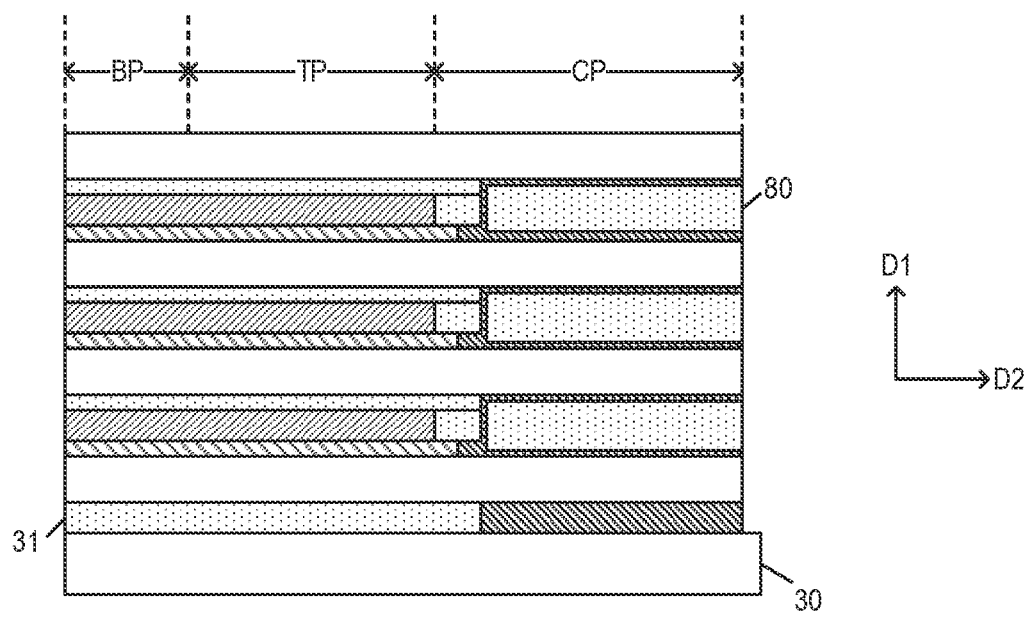
Figure 9:
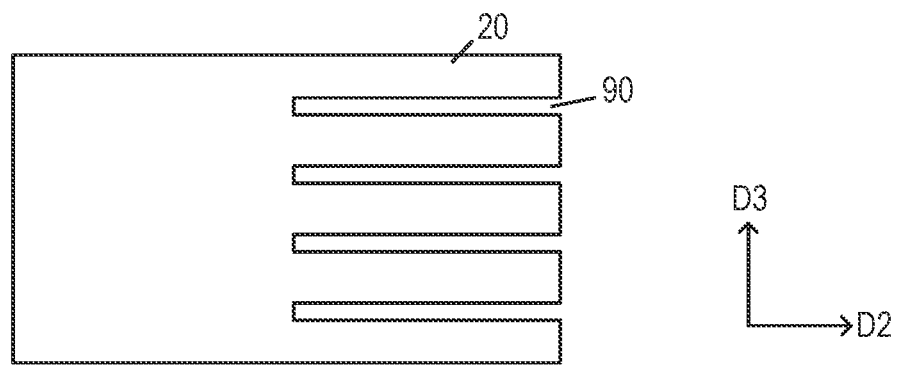
Figure 10:
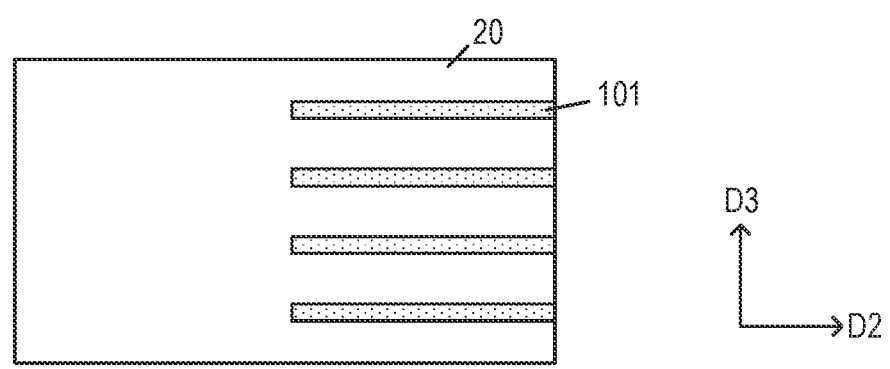

After the bottom electrode layer is formed, the insulating dielectric material such as an oxide (such as silicon dioxide) is deposited in the third gap 41, to form a first filling layer 80 filling up the third gap 41, as shown in FIG. 8. Thereafter, the interlayer isolation layers 20, the first filling layer 80, and the body portion 71 of the bottom electrode layer in the capacitor region CP are etched to form a capacitor isolation trench 90 passing through the stacked layer and exposing the substrate 30, as shown in FIG. 9, and the first filling layer 80 is removed along the capacitor isolation trench 90. A plurality of capacitor isolation trenches 90 are arranged at intervals in the third direction D3, where the third direction D3 is a direction parallel to the top surface of the substrate 30, and the third direction D3 intersects with (e.g., is orthogonal to) the second direction D2. Subsequently, the insulating dielectric material such as an oxide (such as silicon dioxide) is filled into the capacitor isolation trenches 90, to form the capacitor isolation layers 101, as shown in FIG. 10, for isolating the capacitors arranged at intervals in the third direction. Thereafter, a material with high dielectric constant is deposited on the surface of the body portion 71 of the bottom electrode layer to form the dielectric layer 221. A top electrode material (such as tungsten, TiN, or other conductive materials) is deposited on the surface of the dielectric layer 221 to form the top electrode layer 222, as shown in FIG. 11.

In some embodiments, the stacked layer further includes a bit line region BP, the capacitor region CP and the bit line region BP are arranged on two opposite sides of the transistor region TP in a second direction D2, and the second direction D2 is a direction parallel to the top surface of the substrate 30. The forming a first gap includes:

remove the first sacrificial layer 321 in the bit line region BP and the transistor region TP, and form the first gap.

Figure 13:
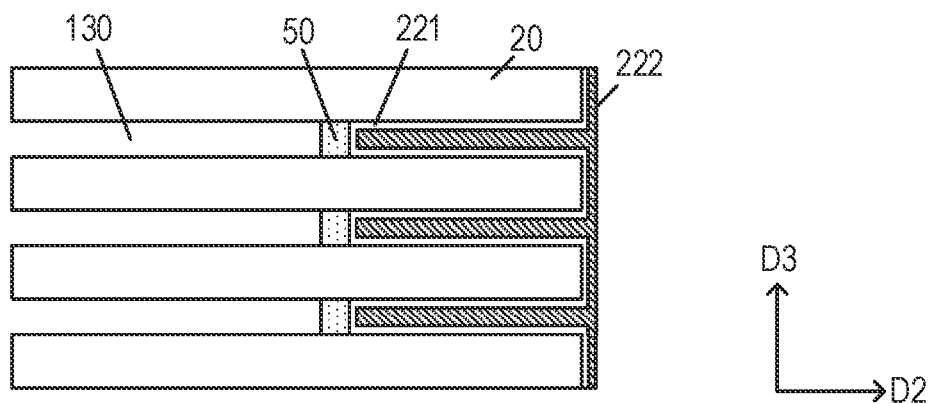
Figure 14:
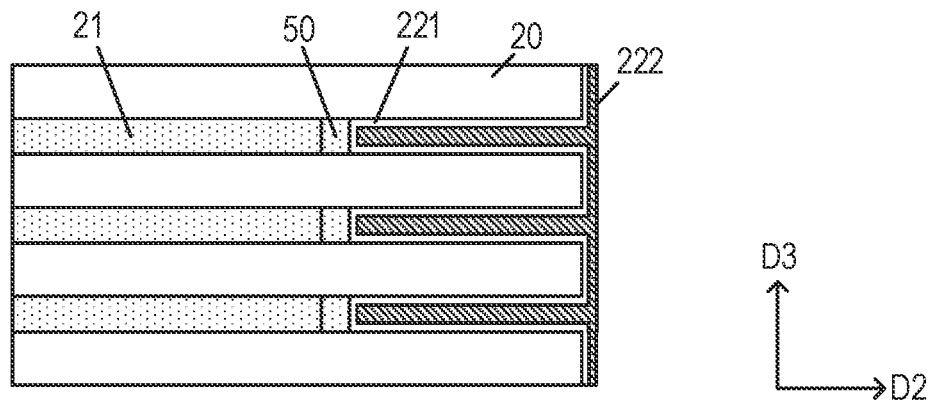

Specifically, after the capacitor is formed, the first sacrificial layer 321 in the bit line region BP and the transistor region TP may be removed by using a lateral etching process, to form the first gap located between the interlayer isolation layer 20 and the second sacrificial layer 322. Next, a channel material may be deposited in the first gap by using a lateral atomic layer deposition process, to form an active layer filling up the first gap. Thereafter, the interlayer isolation layer 20, the second sacrificial layer 322, the third sacrificial layer 323, and the active layer in the bit line region BP and the transistor region TP are etched, to form transistor isolation trenches 130 arranged at intervals in the third direction D3, as shown in FIG. 13. The bottoms of the transistor isolation trenches 130 expose the substrate 30, and divide the active layer into the active pillars 120 arranged at intervals in the third direction D3, as shown in FIG. 12. Subsequently, the insulating dielectric material such as an oxide (such as silicon dioxide) is filled into the transistor isolation trenches 130, to form transistor isolation layers 21, as shown in FIG. 14.

In some embodiments, the forming an active pillar 120 in the first gap includes:

deposit a metal oxide material in the first gap, and form the active pillar 120, as shown in FIG. 12.

The metal oxide material may be, but not limited to, IGZO (indium gallium zinc oxide). The metal oxide material may be transformed between a conductor and an insulator, and using the metal oxide material to form the active pillar 120 does not require a complex doping process, thereby simplifying the memory forming process.

Figure 15:
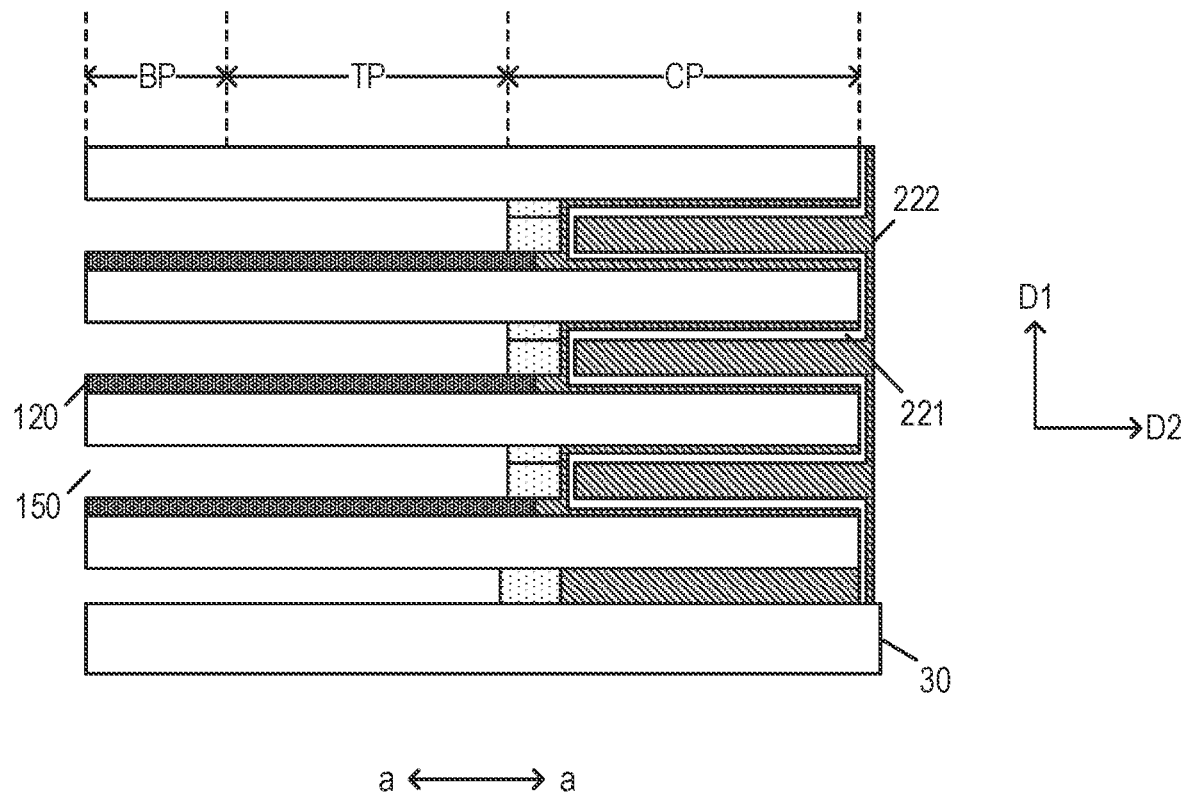

Step S14, remove the second sacrificial layer 322 and the third sacrificial layer 323 in the transistor region TP, and form a second gap 150, as shown in FIG. 15.

Figure 18:
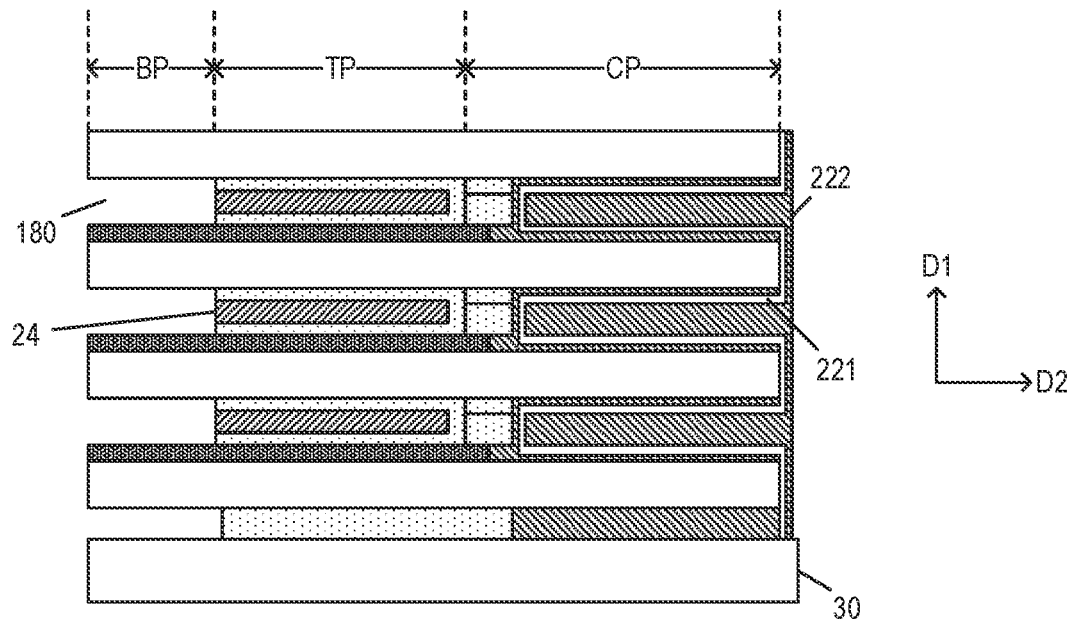

Step S15, form a word line 24 covering a part of the active pillar 120 in the second gap 150, as shown in FIG. 18.

In some embodiments, the forming a second gap 150 includes:

remove the second sacrificial layer 322 and the third sacrificial layer 323 in the bit line region BP and the transistor region TP, and form the second gap 150, as shown in FIG. 15.

Figure 16:
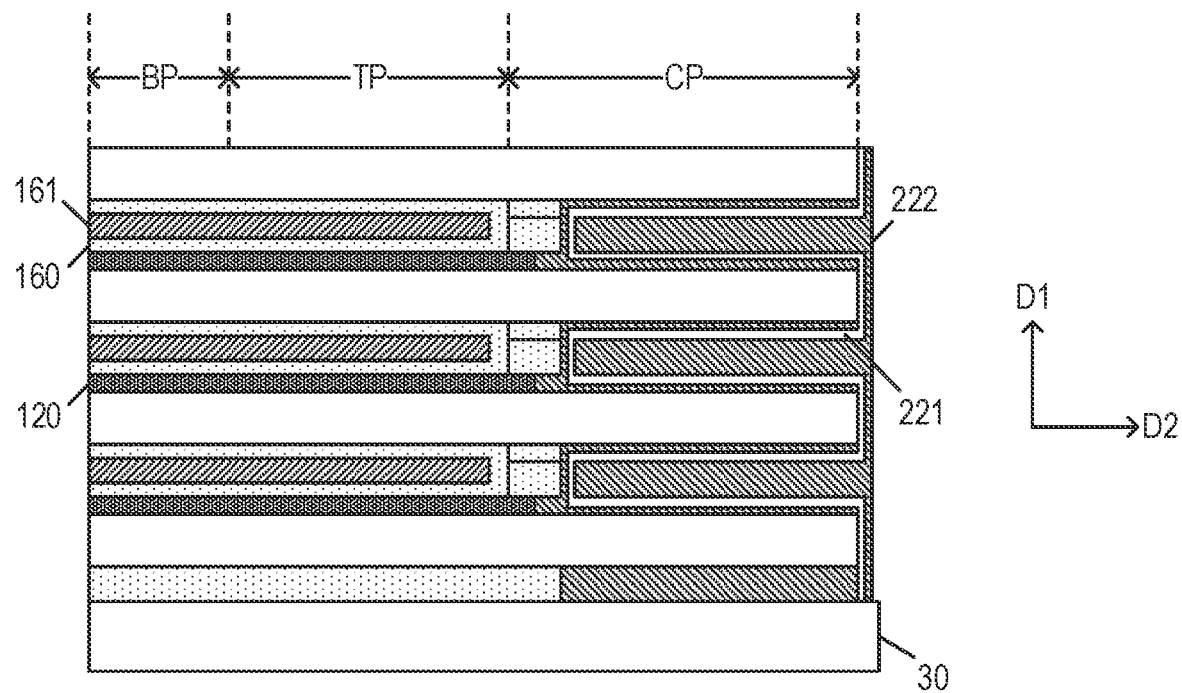
Figure 16:
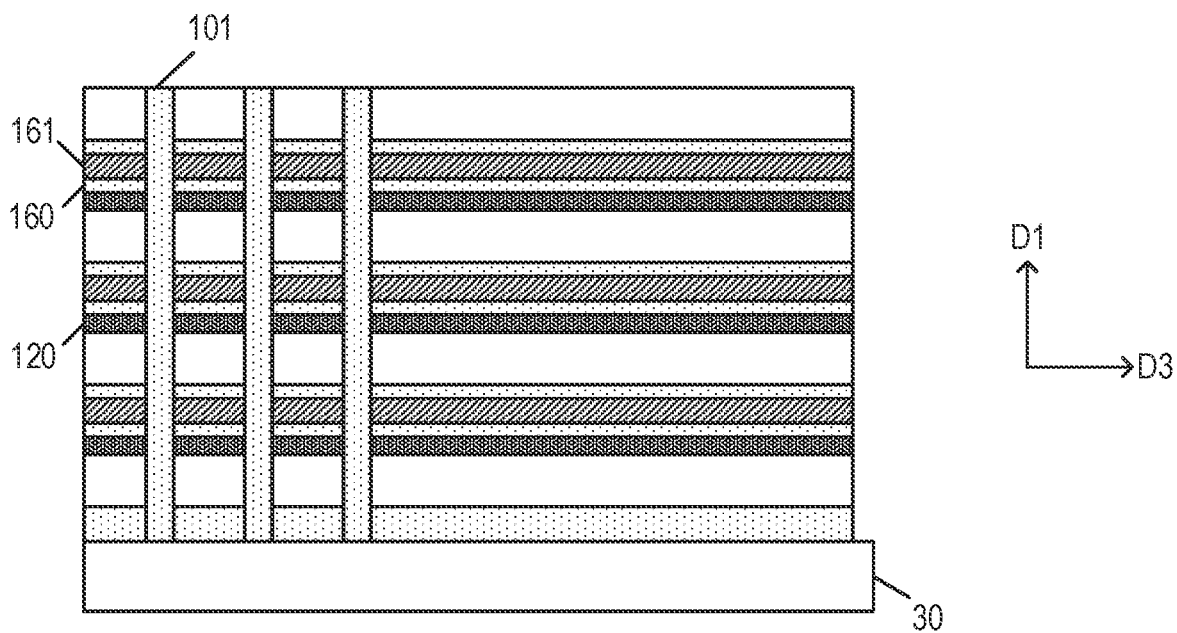

In some embodiments, the active pillar 120 includes a channel region, and a source region and a drain region arranged on two opposite sides of the channel region in the second direction D2, and the drain region is electrically connected to the capacitor. The forming a word line 24 covering a part of the active pillar 120 in the second gap 150 includes:

form a second isolation layer 160 covering an inner wall of the second gap 150, as shown in FIG. 16;

form an initial word line 161 covering a surface of the second isolation layer 160 in the second gap 150, as shown in FIG. 16; and remove the second isolation layer 160 and the initial word line 161 in the bit line region BP, and form a fourth gap 180 between the active pillar 120 and the interlayer isolation layer 20, the initial word line 161 retained in the transistor region TP being used as a word line 24, and projection of the word line 24 on the top surface of the substrate covering projection of the channel region on the top surface of the substrate 30.

Figure 17:
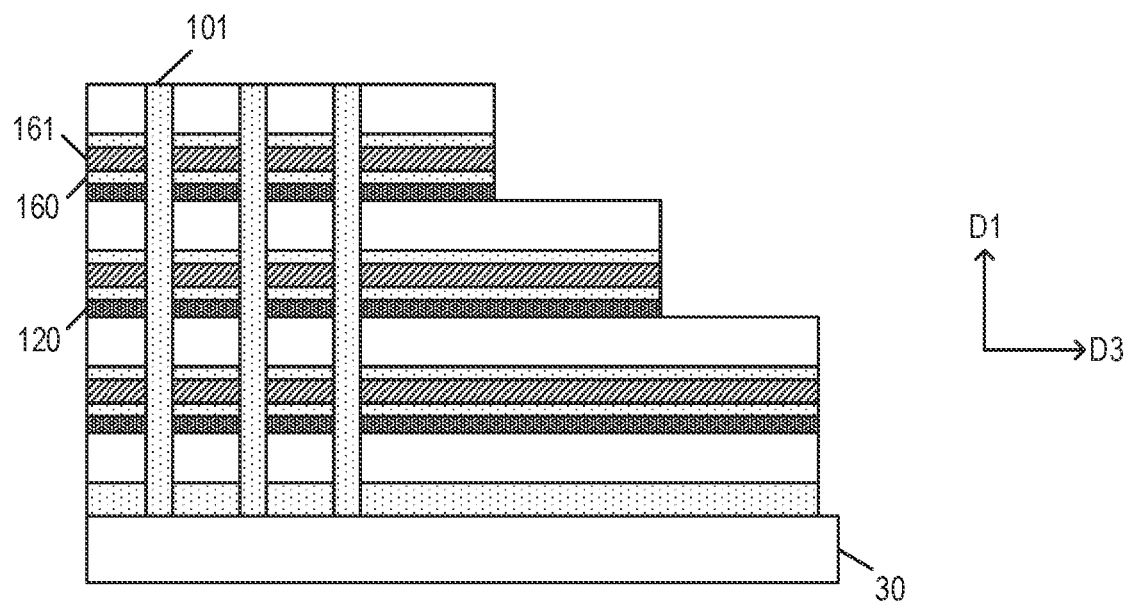

Specifically, the second sacrificial layer 322 and the third sacrificial layer 323 in the transistor region TP and the capacitor region CP may be removed by using a lateral etching process, to form the second gap 150, as shown in FIG. 15. Next, the second isolation layer 160, and the initial word line 161 coated with the second isolation layer 160 may be formed in the second gap 150 by using a lateral atomic layer deposition process, as shown in FIG. 16. The initial word lines 161 extend in the third direction D3, and continuously cover the active pillars 120 arranged at intervals in the third direction D3. A plurality of initial word lines 161 are arranged at intervals in the first direction D1. The ends of the initial word lines 161 extend out of the transistor region TP in the third direction D3 to be electrically connected to word line plugs 25 (referring to FIG. 2). The ends of the initial word lines 161 extending out of the transistor region TP in the third direction D3 are etched to form a stepped structure, as shown in FIG. 17. The stepped structure refers to any adjacent two of the initial word lines 161 in the first direction D1, and one of the initial word lines 161 closer to the substrate 30 in the third direction D3 protrudes from the other of the initial word lines 161. After the stepped structure is formed, the second isolation layer 160 and the initial word line 161 in the bit line region BP are etched back to form the fourth gap 180 between the active pillar 120 and the interlayer isolation layer 20, as shown in FIG. 18. The initial word line 161 retained in the transistor region TP is used as a word line 24, and projection of the word line 24 on the top surface of the substrate 30 covers projection of the channel region on the top surface of the substrate 30.

Figure 19:
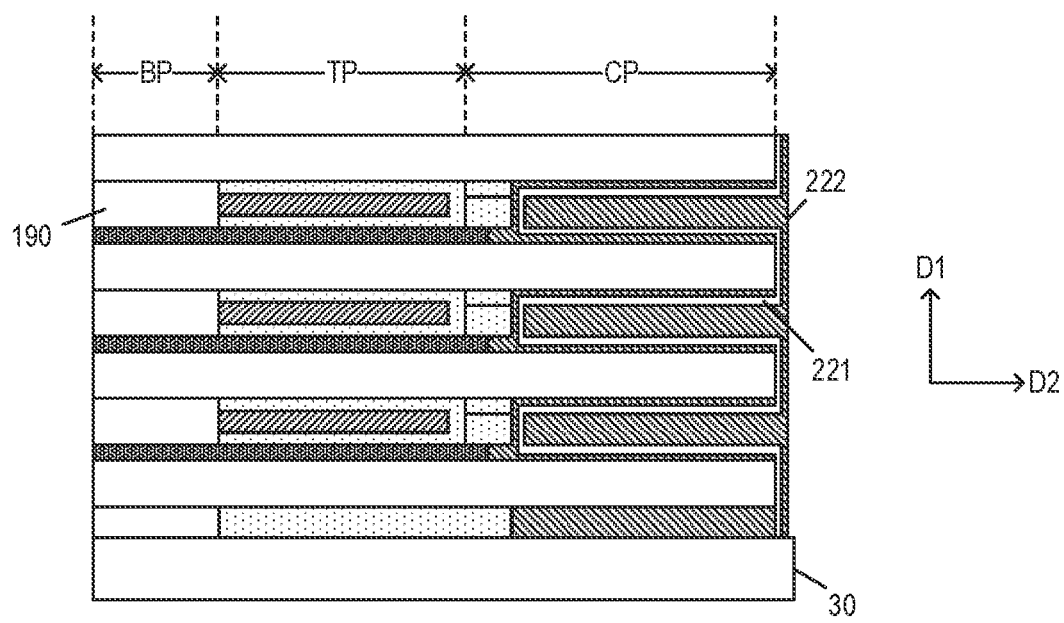
Figure 20:
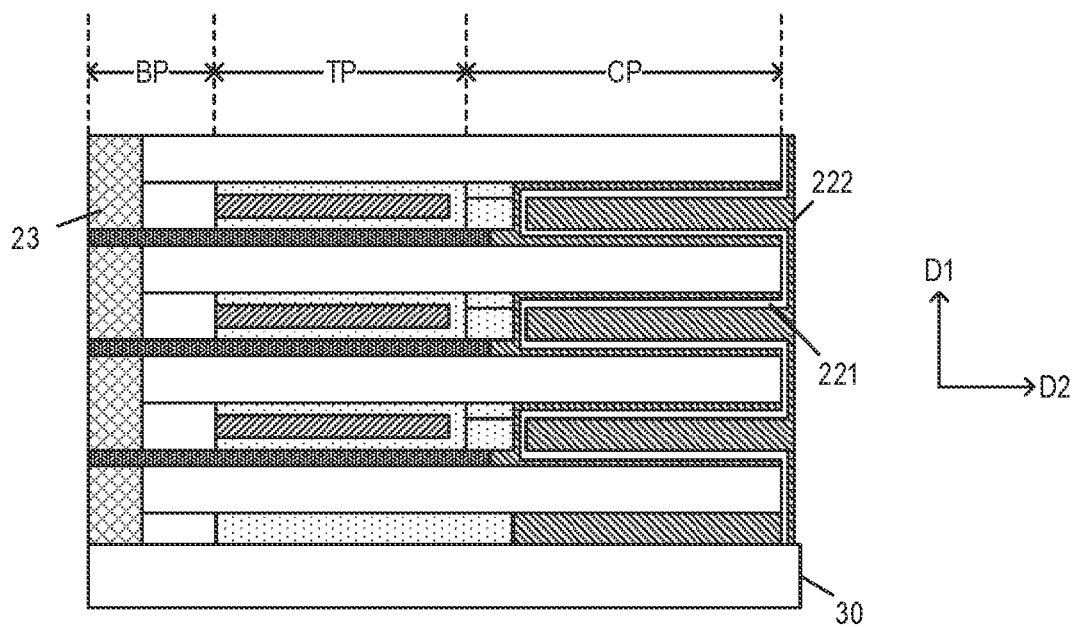

In some embodiments, after the word line covering a part of the active pillar 120 is formed in the second gap 150, the method of forming a memory further includes:

form a third isolation layer 190 filling up the fourth gap 180, as shown in FIG. 19;

remove a part of the third isolation layer 190 and a part of the interlayer isolation layer 20, and form a fifth gap exposing the active pillar 120 in the bit line region BP; and form a bit line 23 in the fifth gap, as shown in FIG. 20.

Specifically, the insulating dielectric material such as an oxide (such as silicon dioxide) may be deposited in the fourth gap 180 by using a lateral atomic layer deposition process, to form the third isolation layer 190 filling up the fourth gap 180. Thereafter, a part of the third isolation layer 190 and a part of the interlayer isolation layer 20 may be etched by using a photoetching process to form a fifth gap exposing the active pillar 120 in the bit line region BP; and a bit line material (such as tungsten, TiN, or other conductive materials) is deposited in the fifth gap to form the bit lines 23 arranged at intervals in the third direction D3. The bit lines 23 extend in the first direction D1, and continuously cover the surfaces of the active pillars 120 arranged at intervals in the first direction D1. The active pillars 120 are inserted into the bit lines 23. On the one hand, the bit lines 23 may be supported by the active pillars 120 to improve the structural stability of the bit lines 23; and on the other hand, stable electric connection between the active region in the active pillar 120 and the bit line 23 may also be ensured, and the problem of poor contact between the bit line 23 and the transistor is reduced or even avoided.

Figure 21:
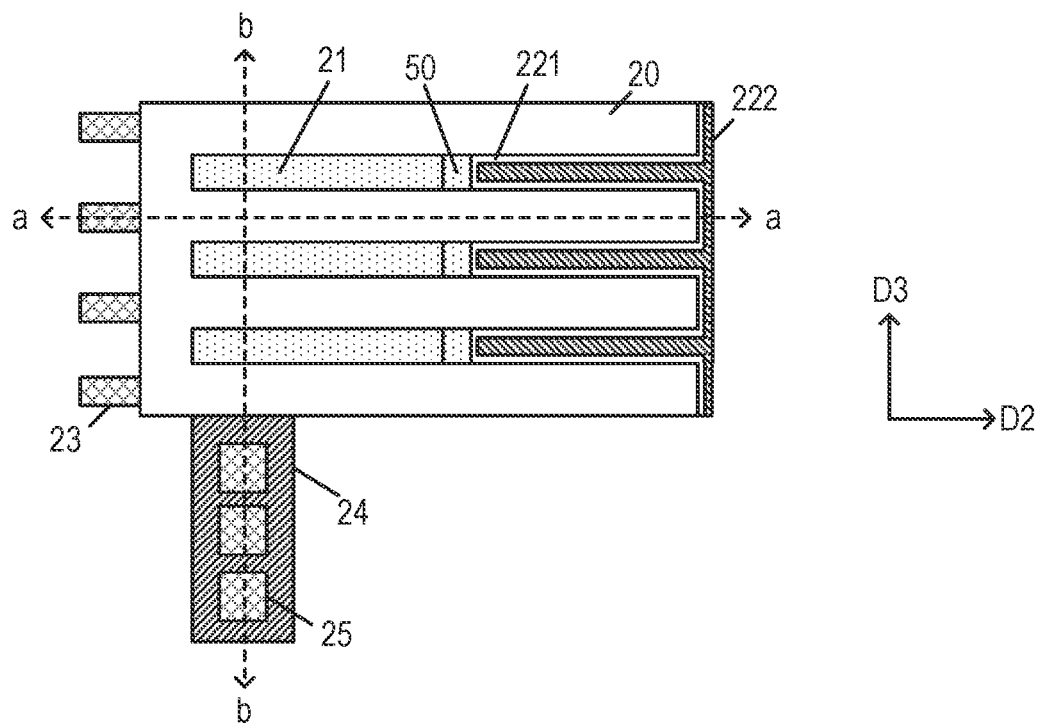
FIG. 21 to FIG. 23 are schematic structural diagrams of a memory according to a specific implementation of the present disclosure.
Figure 22:
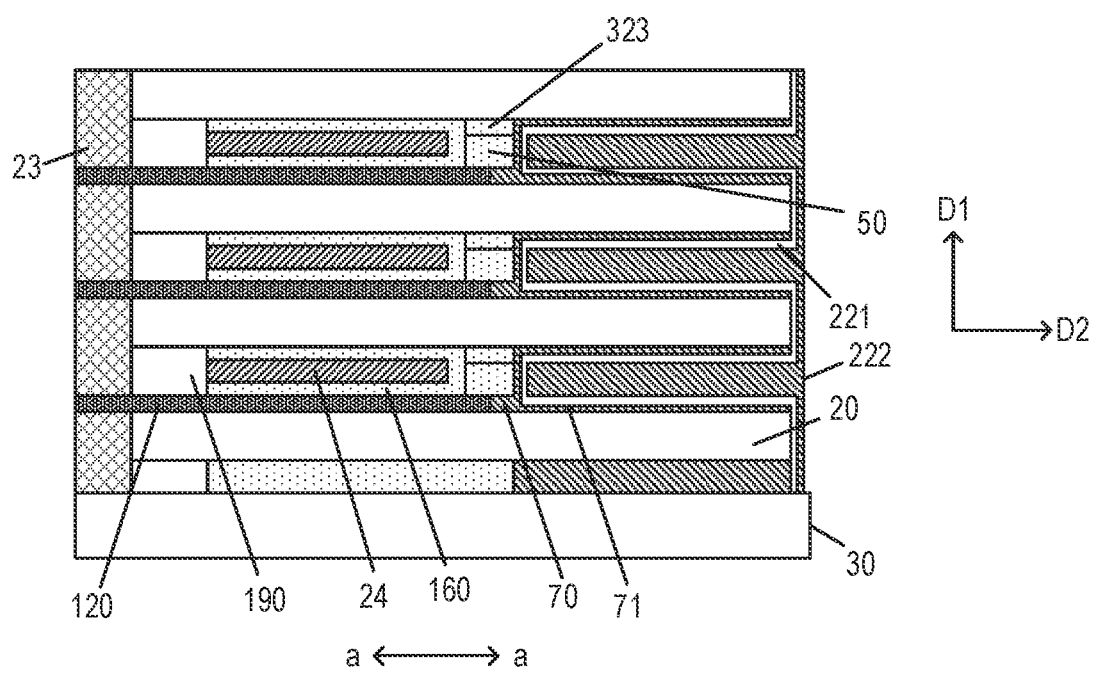
Figure 23:
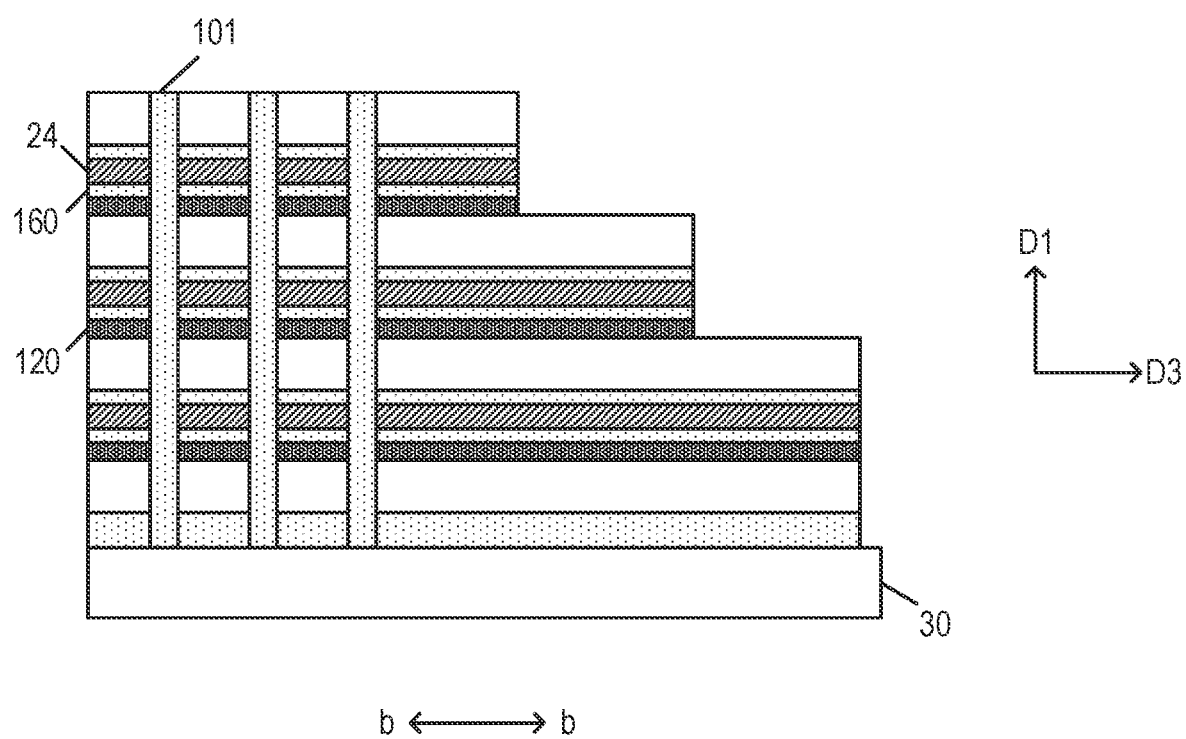

This specific implementation also provides a memory. FIG. 21 to FIG. 23 are schematic structural diagrams of a memory according to a specific implementation of the present disclosure, where FIG. 21 is a top schematic structural diagram of a memory according to this implementation, FIG. 22 is a schematic cross-sectional diagram of a a-a position in FIG. 21, and FIG. 23 is a schematic cross-sectional diagram of a b-b position in FIG. 21. The memory provided in this specific implementation may be formed by using the method of forming a memory shown in FIG. 1 to FIG. 20. As shown in FIG. 21 to FIG. 23, the memory includes:

a substrate 30; and a stacked structure located on a top surface of the substrate 30 and including memory cells arranged at intervals in a first direction D1, where the first direction D1 is a direction perpendicular to the top surface of the substrate 30;

each memory cell includes a transistor and a capacitor electrically connected to the transistor, the transistor includes an active pillar 120, the capacitor includes a bottom electrode layer, the bottom electrode layer includes a terminal portion 70 and a body portion 71, and the terminal portion 70 protrudes from the body portion 71 in a second direction D2 and is in contact and electric connection with the active pillar 120, where the second direction D2 is a direction parallel to the top surface of the substrate 30.

Specifically, the terminal portion 70 and the body portion 71 are in direct contact and electric connection, and the terminal portion 70 protrudes from the body portion 71 in the second direction D2. The terminal portion 70 is lower than the body portion 71 in the first direction D1. The terminal portion 70 is formed and electrically connected to the transistor, which not only contributes to reducing the contact resistance between the capacitor and the transistor, but also ensures the stability of connection between the transistor and the capacitor, thereby further improving the electric performance of the memory.

In some embodiments, the active pillar 120 includes a channel region, and a source region and a drain region arranged on two opposite sides of the channel region in the second direction D2, and the terminal portion 70 is in contact and electric connection with the drain region; the stacked structure further includes memory cells arranged at intervals in a third direction D3, the third direction D3 is a direction parallel to the top surface of the substrate 30, and the second direction D2 intersects with the third direction D3; and the stacked structure further includes word lines 24 arranged at intervals in the first direction D1, and the word lines 24 extend in the third direction D3 and continuously cover the channel regions arranged at intervals in the third direction D3.

For example, as shown in FIG. 21 to FIG. 23, the stacked structure includes a plurality of layers of memory cells arranged at intervals in the first direction D1. Each layer of memory cells includes a plurality of memory cells arranged at intervals in the third direction D3, and the interlayer isolation layer 20 is arranged between adjacent two layers of memory cells, such that the plurality of memory cells form a three-dimensional stacked layer. Each memory cell includes a transistor and a capacitor. The transistor includes the active pillar 120, and the active pillar 120 includes a channel region, and a source region and a drain region arranged on two opposite sides of the channel region in the second direction D2. The capacitor includes a bottom electrode layer, a dielectric layer 221 covering a surface of the bottom electrode layer, and a top electrode layer 222 covering a surface of the dielectric layer 221. The bottom electrode layer includes the terminal portion 70 in contact and electric connection with the drain region, and the body portion 71 electrically connected to the terminal portion 70. The dielectric layer 221 covers a surface of the body portion 71. "A plurality of" in this specific implementation refers to two or more.

The stacked structure includes a transistor region, and a capacitor region and a bit line region arranged on two opposite sides of the transistor region in the second direction D2. The transistor region is configured to form the transistor, and the capacitor region is configured to form the capacitor. The stacked structure further includes the word lines 24 arranged at intervals in the first direction D1, and the word lines 24 extend in the third direction D3 and continuously cover the channel regions arranged at intervals in the third direction D3. The word lines 24 are electrically isolated from the capacitor through the first isolation layer 50 and the third sacrificial layer 323 located above the first isolation layer 50. The ends of the word lines 24 extend out of the transistor region in the third direction D3 to be electrically connected to the word line plugs 25. The ends of the plurality of word lines 24 extending out of the transistor region in the third direction D3 form a stepped structure, to lead out signals of the plurality of word lines 24. The stepped structure refers to any adjacent two of the word lines 24 in the first direction D1, and one of the word lines 24 closer to the substrate 30 in the third direction D3 protrudes from the other of the word lines 24.

In some embodiments, the stacked structure further includes:

second isolation layers 160 arranged at intervals in the first direction D1, located on surfaces of the active pillars 120, and wrapping the word lines 24. The second isolation layer 160 located between the word line 24 and the channel region is used as a gate dielectric layer of the transistor.

In some embodiments, the stacked structure further includes:

bit lines 23 arranged at intervals in the third direction D3, extending in the first direction D1, and continuously in contact and electric connection with the source regions arranged at intervals in the first direction D1. The bit lines 23 and the word lines 24 are electrically isolated through the third isolation layer 190.

In some embodiments, at least a part of the source region of the active pillar 120 extends into the bit line 23.

According to the memory and the method of forming a memory provided by some embodiments of this specific implementation, the stacked layer in which the interlayer isolation layers and the sacrificial layer group are alternately stacked is first formed on the top surface of the substrate, the first sacrificial layer in the sacrificial layer group is then replaced with the active pillar, and the second sacrificial layer and the third sacrificial layer in the sacrificial layer group are at least replaced with the word line. On the one hand, by forming the sacrificial layer group including the first sacrificial layer, the second sacrificial layer, and the third sacrificial layer, the internal stress of the stacked layer can be reduced, thereby being helpful to increase the stacking height of the stacked layer and the storage capacity of the memory to improve the yield and performance of the memory; and on the other hand, the active pillar and the word line are formed by replacing the sacrificial layers, such that the formation of transistor in the memory does not require a complex epitaxial growth and doping process, and the yield of the memory can be further improved while simplifying the memory manufacturing process. Moreover, the capacitor in the memory provided in some embodiments of the present disclosure includes the bottom electrode layer, the bottom electrode layer includes the terminal portion and the body portion, and the terminal portion protrudes from the body portion in the second direction and is in contact and electric connection with the active pillar, such that the contact resistance between the transistor and the capacitor can be reduced to further improve the electric performance of the memory.

The above described are merely preferred implementations of the present disclosure. It should be noted that several improvements and modifications may further be made by a person of ordinary skill in the art without departing from the principle of the present disclosure, and such improvements and modifications should also be deemed as falling within the protection scope of the present disclosure.

The invention claimed is:

1. A memory, comprising:
   a substrate; and
   a stacked structure located on a top surface of the substrate and comprising memory cells arranged at intervals in a first direction, wherein the first direction is a direction perpendicular to the top surface of the substrate; and
   each memory cell comprises a transistor and a capacitor electrically connected to the transistor, the transistor comprises an active pillar, the capacitor comprises a bottom electrode layer, the bottom electrode layer comprises a terminal portion and a body portion, and the terminal portion protrudes from the body portion in a second direction and is in contact and electric connection with the active pillar, wherein the second direction is a direction parallel to the top surface of the substrate.

2. The memory according to claim 1, wherein the active pillar comprises a channel region, and a source region and a drain region arranged on two opposite sides of the channel region in the second direction, and the terminal portion is in contact and electric connection with the drain region; the stacked structure further comprises memory cells arranged at intervals in a third direction, the third direction is a direction parallel to the top surface of the substrate, and the second direction intersects with the third direction; and
   the stacked structure further comprises word lines arranged at intervals in the first direction, and the word lines extend in the third direction and continuously cover the channel regions arranged at intervals in the third direction.

3. The memory according to claim 2, wherein the stacked structure further comprises:
   second isolation layers, arranged at intervals in the first direction, located on surfaces of the active pillars, and wrapping the word lines.

4. The memory according to claim 2, wherein the stacked structure further comprises:
   bit lines, arranged at intervals in the third direction, extending in the first direction, and continuously in contact and electric connection with the source regions arranged at intervals in the first direction.

5. The memory according to claim 4, wherein at least a part of the source region of the active pillar extends into the bit line.

* * * * *